US011582888B2

(12) United States Patent
Gao (10) Patent No.: US 11,582,888 B2
(45) Date of Patent: Feb. 14, 2023

(54) HYBRID COOLING DEVICE FOR ACCELERATION HARDWARE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 142 days.

(21) Appl. No.: 17/213,146

(22) Filed: Mar. 25, 2021

(65) Prior Publication Data

US 2022/0312643 A1 Sep. 29, 2022

(51) Int. Cl.
 *H05K 7/20* (2006.01)
 *H01L 23/40* (2006.01)
 *H01L 23/427* (2006.01)

(52) U.S. Cl.
 CPC ......... *H05K 7/20809* (2013.01); *H01L 23/40* (2013.01); *H01L 23/427* (2013.01); *H05K 7/20736* (2013.01); *H05K 7/20836* (2013.01)

(58) Field of Classification Search
 CPC .. G06F 1/20; H05K 7/20809; H05K 7/20736; H05K 7/20836; H05K 7/20727; H05K 7/20772; H05K 7/20781; H05K 7/20818; H01L 23/427; H01L 23/40
 See application file for complete search history.

(56) References Cited

U.S. PATENT DOCUMENTS

| 5,720,338 A * | 2/1998 | Larson ................. F28F 21/065 257/E23.09 |
| 6,055,157 A | 4/2000 | Bartilson |
| 9,408,329 B2 * | 8/2016 | Iyengar ............. H05K 7/20809 |
| 2005/0248922 A1 * | 11/2005 | Chu ................. H05K 7/20809 361/700 |
| 2007/0042514 A1 * | 2/2007 | Wu ........................ G06F 1/183 361/688 |
| 2018/0235108 A1 | 8/2018 | Samadiani et al. |
| 2018/0307283 A1 * | 10/2018 | Dupont .................. G06F 1/203 |
| 2020/0403283 A1 * | 12/2020 | Gao ................. H05K 7/20309 |
| 2020/0404805 A1 * | 12/2020 | Gao ................. H05K 7/20781 |

* cited by examiner

*Primary Examiner* — Adam B Dravininkas
(74) *Attorney, Agent, or Firm* — Womble Bond Dickinson (US) LLP (57) ABSTRACT

Described herein is a hybrid cooling device and a cooling method that use a combination of phase change cooling and air cooling. The hybrid cooling device includes a closed loop two phase system, one or more fans, and an assembly clamp. The two phase system further includes a cold plate, an integrated channel, and a radiator, and a pressure sensor. The cold plate can include phase change fluid for extracting heat from electronics on a printed circuit board sandwiched between the cold plate and the assembly clamp. The one or more fans can be used to create airflows for cooling both the cold plate and the radiator. The pressure sensor can be used to control the operation of the hybrid cooling device, which can be deployed in different system environments and server configurations.

20 Claims, 10 Drawing Sheets

HYBRID COOLING DEVICE FOR ACCELERATION HARDWARE

FIELD OF THE INVENTION

Embodiments of the present disclosure relate generally to cooling systems. More particularly, embodiments of the disclosure relate to a hybrid cooling device and a hybrid cooling method that use both phase change cooling and air cooling.

BACKGROUND

A high power density device is a computing device that is packaged with high performance processors (e.g., such as GPU, ASIC, heterogeneous computing based IC chip or chiplet). Such high power density devices are increasingly popular due to the continuous high computing need. A high power density device tends to generate a large amount of heat and is often integrated into a server chassis. Therefore, for a high power density device to function properly, a proper thermal environment for servers, racks, and data center facility is needed.

Although liquid cooling can be a promising cooling solution for high power density devices, particular when the power budget for a single chip exceeds a threshold (e.g., 400 W), the required accompanying facility can be a bottleneck, because such a liquid cooling solution has certain requirements for supply inlet temperatures, flow rates and pressures that exceed the capability of a typical data center. Even if a data center facility can be developed to meet the requirements, the cost would be too high.

Further complicating the problem is that many high performance hardware components are connected through a peripheral component interconnect express (PCIe) expansion bus. A liquid cooling solution for such hardware components and packages requires completely different architecture compared to Mezzanine connector based cards.

Previous cooling solutions for the PCIE based electronics focus on desktop products, rather than on hyper scale cloud data centers. Such cooling solutions may not be feasible for integration into servers in a cloud data center. Further, these solutions may be unscalable, inversatile, not reliable enough, or too costly. In addition, most of the solutions are air cooling based, which may not satisfy the constantly increasing power density.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to various embodiments, described herein is a hybrid cooling device and a cooling method that use a combination of phase change cooling and air cooling. The hybrid cooling device includes a closed loop two phase system, one or more fans, and an assembly clamp. The two phase system further includes a cold plate, an integrated channel, and a radiator as a condenser. The cold plate can include phase change fluid for extracting heat from electronics on a printed circuit board (PCB) sandwiched between the cold plate and the assembly clamp. The one or more fans can be used to create airflows for cooling both the electronics on the PCB and the radiator. A pressure sensor and a temperature sensor can be used to control the operation of the hybrid cooling device, which can be integrated into different system environments and server configurations.

In one embodiment, the hybrid cooling device further includes a device frame, to which the radiator, the integrated channel, and the cold plate are attached. Further, the hybrid cooling device can include an adapting stiffener positioned between the cold plate and the electronics on the PCB, and one or more elastic channels. The adapting stiffener and the one or more elastic channels operate in conjunction to maintain proper pressure on the electronics on the PCB.

In one embodiment, the hybrid cooling device further includes a moving axis in the one of the elastic channels, and one end of the assembly clamp is inserted into the elastic channels through the moving axis such that the end of the assembly clamp is moveable on the elastic channel. This elastic channel can provide forces on the moving axis on both sides horizontally to properly fix the PCB at a particular position within the hybrid cooling device.

In one embodiment, the electronics on the PCB can include one or more of a chip or a power electronics, and wherein the PCB where the electronics installed on are connected by a peripheral component interconnect express (PCIe) bus to a server main PCB.

In one embodiment, the integrated channel includes a vapor line and a liquid line, the liquid line for passing liquid from the radiator to the cold plate, and the vapor line for passing vapor from the cold plate to the radiator. In one embodiment, the vapor line and liquid line may be designed in different physical dimensions for better performance.

In one embodiment, each of the one or more fans can be a fan integrated into the hybrid cooling device or a separate fan. The airflows created by the one or more fans pass through the PCB through a first dedicated channel, and pass through the radiator through a second dedicated channel.

In one embodiment, the hybrid cooling device can include a temperature sensor and a pressure sensor to control the operation of the hybrid cooling device. In one embodiment, the hybrid cooling device can include only a pressure sensor, and the pressure sensor is pre-integrated on the vapor line in the hybrid cooling device.

In one embodiment, the hybrid cooling method can be deployed to different chassis, e.g., blade servers. Further, multiple electronics on a PCB or multiple PCBs can be packaged within the hybrid cooling device. A variety of clamping methods can be used for sandwiching the PCBs.

The hybrid cooling device can be deployed in any server or chassis environment, and is compatible with different heterogeneous hardware configurations for complex and multiple heterogeneous computing workloads. As such, the hybrid cooling device is scalable and interoperable for different server system designs and configurations, including different heterogeneous hardware expansions. In addition, the solution is highly efficient since fluid is self-driven with phase change technologies.

The various embodiments provide a solution for hyperscale data centers applications and corresponding servers in a cloud environment, as well as for edge computing system, either in edge cluster or edge devices. The cooling solution described in the various embodiments can be used for cooling high power density electronics. With a complete packing method for designing hybrid cooling devices, the cooling solution can be configured for different hybrid designs such as phase change with air in parallel, phase change liquid cooling only and so on.

Figures 1A, 1B:
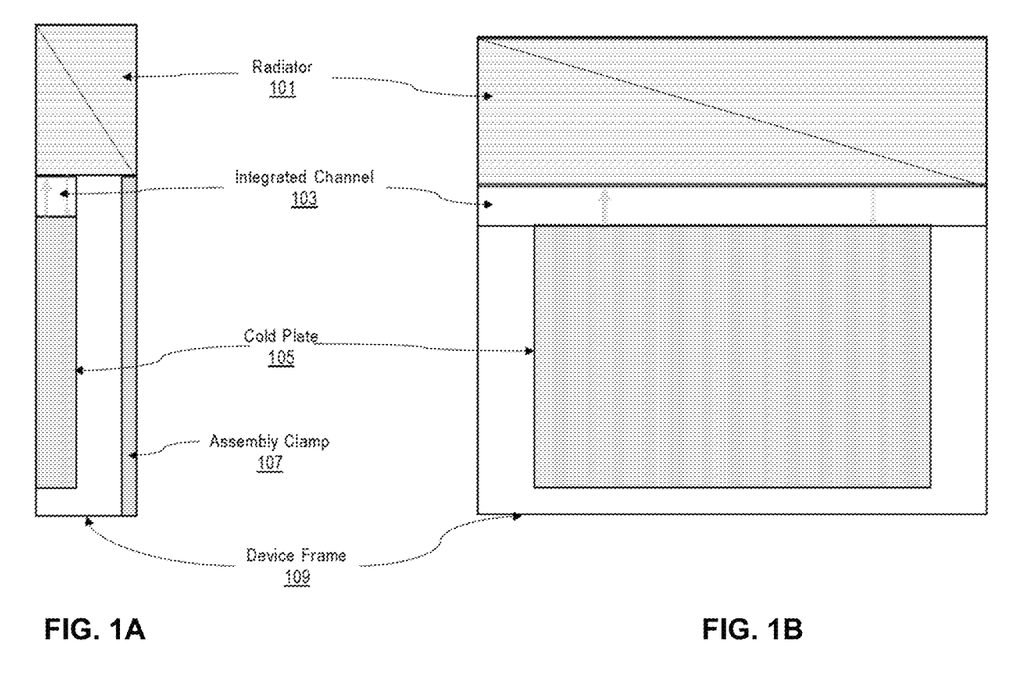
FIGS. 1A-1B show hardware for a hybrid cooling device according to one embodiment.

FIGS. 1A-1B show a hybrid cooling device according to one embodiment. FIG. 1A shows a front view of the hybrid cooling device, and FIG. 1B shows a side view of the hybrid cooling device.

As shown, the hybrid cooling device include a radiator 101, an integrated channel 103, a cold plate 105, an assembly clamp 107, and a device frame 109. The radiator 101, the integrated channel 103, and the cold plate 105 can be combined into a single unit. The single unit constitutes the main component of the hybrid cooling device.

However, despite being a single unit, the integral designs for the three components 101, 103 and 105 can be different depending on actual implementations and specific requirements of different users.

The device frame 109 can be a hardware frame, to which the radiator 101, the integrated channel 103, and the cold plate 105 are attached. The integrated channel 103 can include a liquid line and a vapor line for connecting the radiator and the cold plate. The assembly clamp 107, which is described in detail below, can be used to hold electronics on a printed circuit board (PCB) with proper pressure.

Figure 2A:
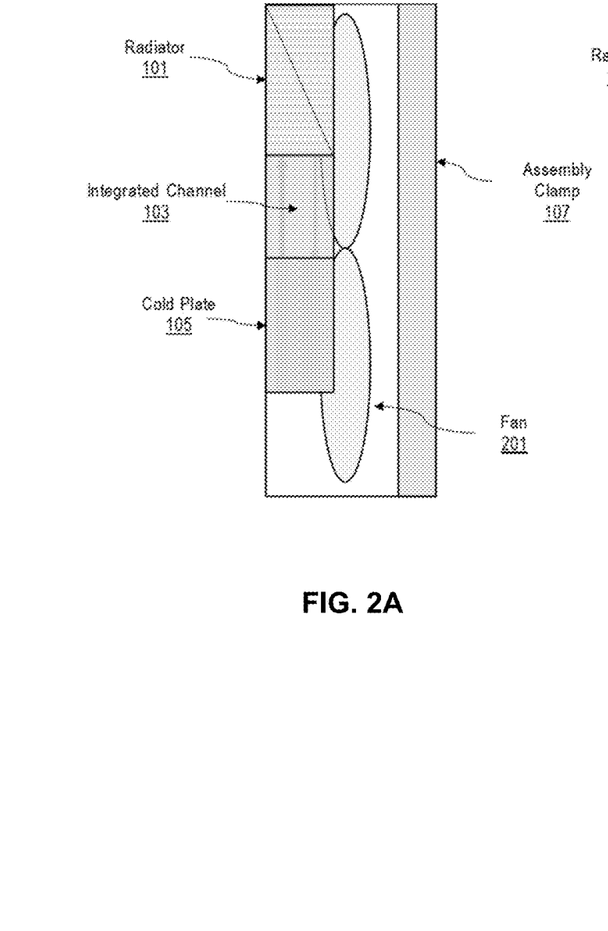
FIGS. 2A-2B show a hardware design with fans in the hybrid cooling device according to one embodiment.
Figure 2B:
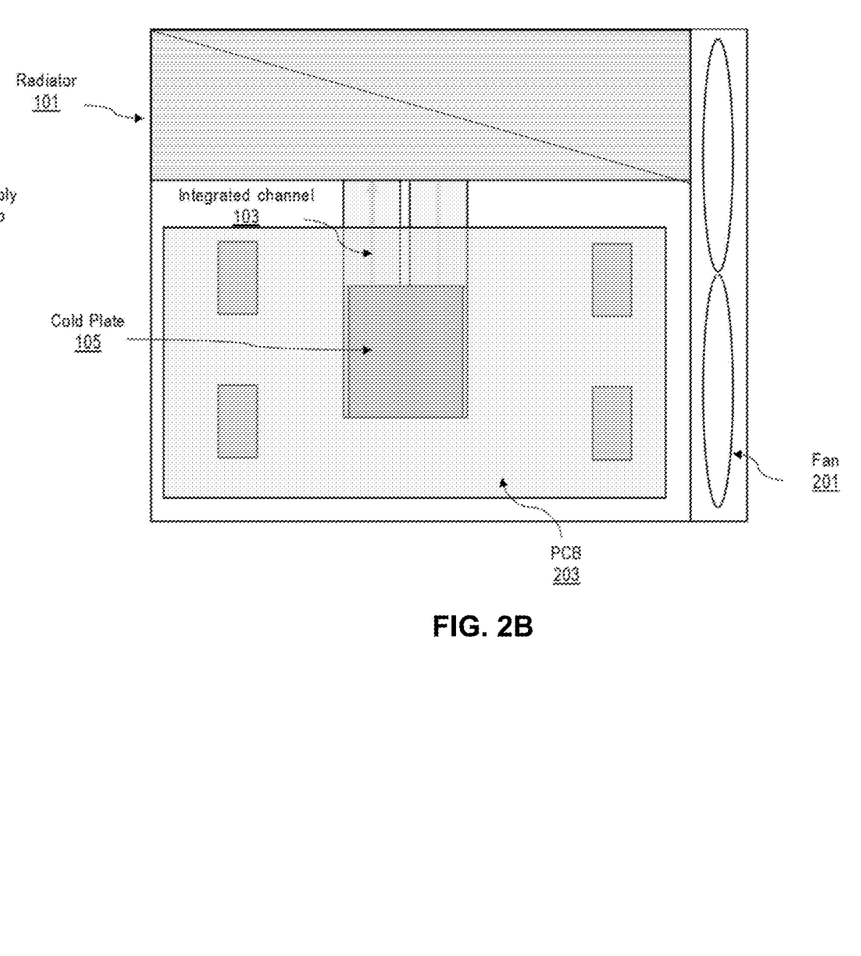

FIGS. 2A-2B further show the hybrid cooling device according to one embodiment. FIG. 2A shows a front view of the hybrid cooling device, and FIG. 1B shows a side view of the hybrid cooling device.

As shown, the hybrid cooling device can include a fan 201. The fan 201 and the single unit described above, provides a hybrid cooling environment for a printed circuit board (PCB) 203 with high power density electronics installed thereon.

In one embodiment, the PCB 203 be an acceleration PCB that includes multiple hardware components to speed up data communication, storage and retrieval, encryption and decryption, mathematical operations, graphics, and web page viewing, etc. The PCB 203 can be attached to the cold plate 105. Both the radiator 101 and the PCB 203 can be air cooled by the fan 201. The solution shown in FIG. 2A can be understood as that the fans are integrated together as one unit. This means the fan design is optimized in terms of locations, fan selection and airflow management.

In one embodiment, the structural layout of the hybrid cooling device enables the fan 201 to blow direct or indirect airflows towards both the radiator 101 and the electronics on the PCB 203. As such, the fan 201 can provide direct air cooling and indirect air cooling. The fan 201 can be an integrated unit of the hybrid cooling device, or a separate module attached to the hybrid cooling device.

Figure 3A:
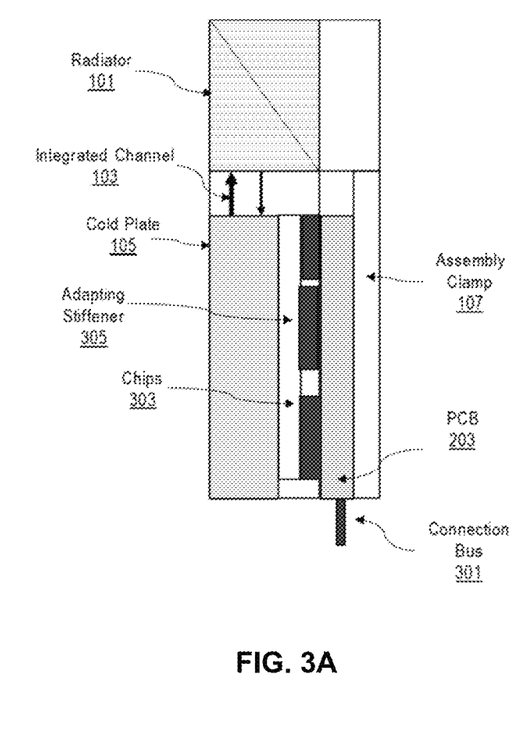
FIGS. 3A-3C show the hybrid cooling device combined with electronics on a printed circuit board according to one embodiment.
Figure 3B:
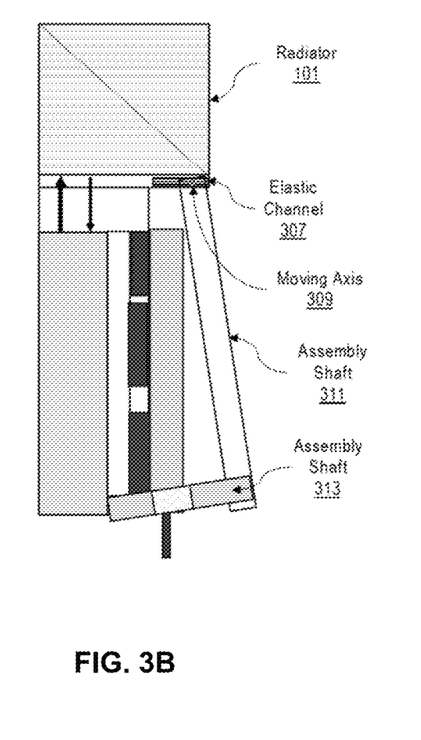
Figure 3C:
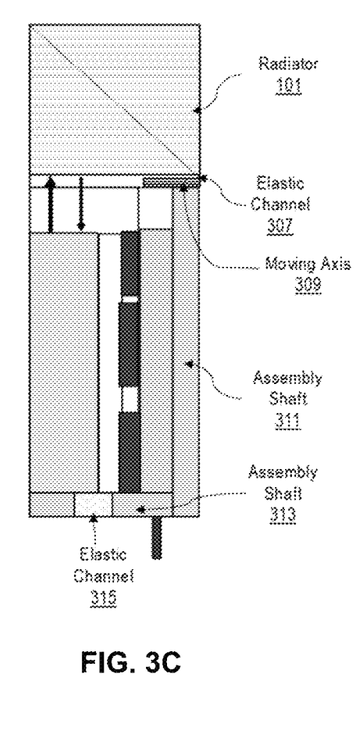

FIGS. 3A-3C show the hybrid cooling device combined with an PCB according to one embodiment. FIG. 3A illustrates an overall structure of the hybrid cooling device, and FIGS. 3B and 3C provides additional implementation details.

In FIG. 3A, the PCB 203 can have different types of chips or power electronics installed thereon. An adapting stiffener 305 can be used between the cold plate 105 and the chips or power electronics on the PCB 203 to ensure that the hybrid cooling device is properly assembled. In one embodiment, the adapting stiffener 305 can be resilient, and can be made of elastic material to accommodate the different heights of electronics installed on the PCB 203.

The hybrid cooling device further includes a connection bus 301 used to connect the different electronics on the PCT 203. The connection bus 301 can be a peripheral component interconnect express (PCIe) bus, which is an interface standard for connecting high-speed components.

In FIG. 3A, the cold portion of the hybrid cooling device can cover all electronics on the PCB 203 such that they all can be cooled by the cold plate 105.

FIG. 3B illustrates the assembly clamp 107 in detail. The assembly clamp 107 includes four parts: an elastic channel 307, a moving axis 309, and two assembly shafts 311 and 313. In this figure, the clamp assembly 107 is not locked. As shown, one end of the assembly shaft 311 is inserted into the elastic channel 307 through the moving axis 309, and therefore, this end is moveable on the elastic channel 307. The elastic channel 307 can provide forces on the moving axis 309 on both sides along the horizontal direction to ensure proper fixing of the hybrid cooling device in terms of the PCB 203, as well as ensuring proper thermal contacting between the electronics and the stiffener.

FIG. 3C shows a view of the hybrid cooling device when it is locked. As shown, in addition to the elastic channel 307, the hybrid cooling device can include another elastic channel 315 on the assembly shaft 315. The two assembly shafts 311 and 313 are connected together to form the assembly clamp 107.

The assembly clamp 107 can be locked and unlocked by turning around the moving axis 309. When the assembly clamp 107 is locked, the PCB 203, the chips 303 (also referred to as electronics) on the PCB 203, and the adapting stiffener 305 can be sandwiched between the cold plate 105 and the assembly shaft 107. Further, when the assembly clamp 107 is locked, the two elastic channels 307 and 315 can ensure that proper pressure be exerted on the chips 303 and the PCB 203 to avoid damages, and to prevent them from malfunctions. The elastic channels 307 and 315 can also ensure proper thermal contacting between the cold plate 105 and the chips 303.

Figure 4A:
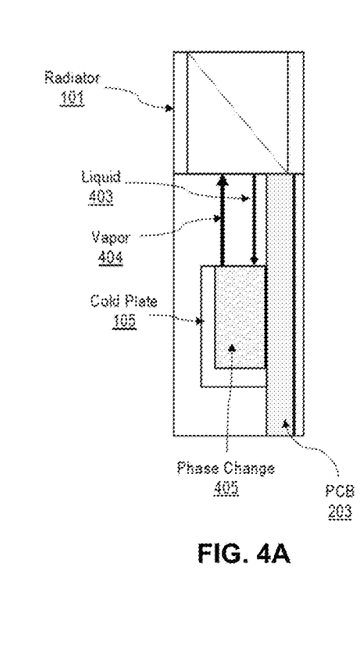
FIGS. 4A-4C show thermal management within the hybrid cooling device according to one embodiment.
Figure 4B:
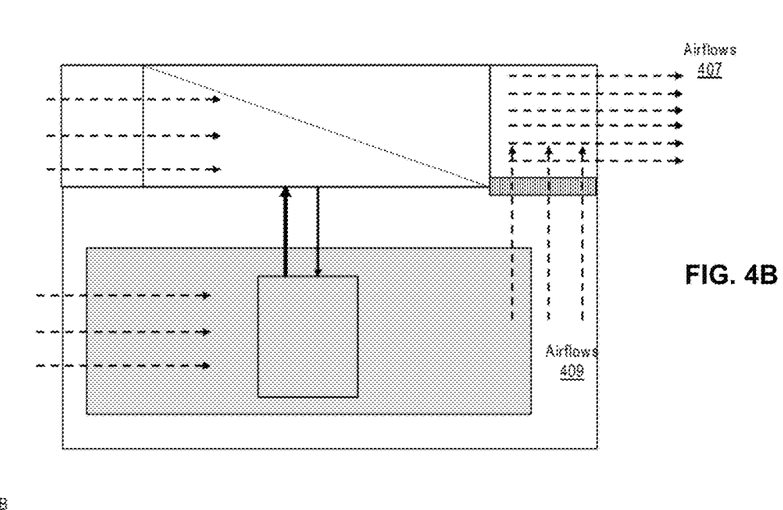
Figure 4C:
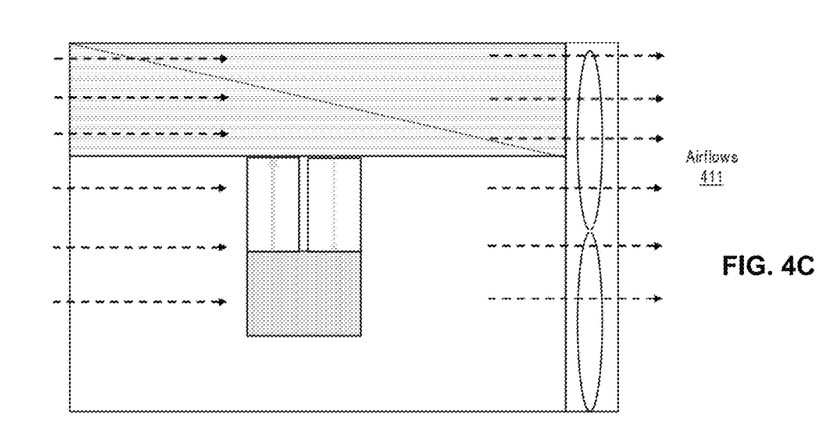

FIGS. 4A-4C show thermal management within the hybrid cooling device and a hybrid environment according to one embodiment. FIG. 4A shows a front view of the hybrid cooling device, and FIGS. 4B-4C show a front view of the hybrid cooling device.

As shown in FIG. 4A, the cold plate 105 and the radiator 101 are connected by a liquid line 403 and a vapor line 404, each of which is a pipe that vapor, air, or fluid can pass through. The liquid line 403 and the vapor line 404 form the integrated channel 103 described in FIG. 2A.

In FIG. 4A, a phase change 405 can occur within the cold plate 105 as a result of heat being extracted from the electronics/chips on the PCB 203. Fluid from the radiator 101 can pass through the liquid line 403 to the cold plate 105, where the fluid changes its phase to vapor 404 after absorbing the heat extracted from the chips on the PCB 203. The vapor carrying latent heat does not vary its temperature due to the phase change. The phase change causes a pressure increase in the cold plate 105, and the increased pressure elevates the vapor to the radiator 101 through the vapor line 404.

The radiator 101 can function as a condensing unit to condense the vapor elevated from the cold plate 105 back to liquid by extracting its latent heat from the vapor. The liquid can return to the cold plate driven by the gravity force.

FIG. 4B shows airflows 407 and 409 that are created by a fan, e.g., the fan 201 illustrated in FIG. 2A and FIG. 2B. The fan can create the airflows 407 and 409 either by pumping or pulling air. The fan can be on either side of the hybrid cooling device.

In one embodiment, the airflows 407 can pass through the radiator 101 to assist the radiator 101 in condensing vapor to liquid, and the airflows 409 can pass through the chips or electronics on the PCB 203 to provide air cooling to the chips or electronics on the PCB 203. In FIG. 4B, the hybrid cooling device uses dedicated channels to manage and optimize the airflows 407 and 409.

Alternatively, FIG. 4C shows another design for thermal management, where airflows 411 pass through the radiator 101 and the PCB 203 and the electronics on the PCB 203 in parallel since no dedicated channels for airflows 411 are used.

FIG. 4B and FIG. 4C show different airflow management within the hybrid cooling device with different fan implementations. This can be understood as how the full set of the hybrid cooling device is used and configured to create different hybrid cooling environments. FIG. 4B shows that the portion of inlet airflow is used for cooling the radiator to condense the vapor back to liquid and the other portion is used for cooling the other air cooled electronics on the PCB directly. The heated air is converged to the dedicated channel driven by the fan. While in FIG. 4C, the two portions of airflows form separate paths.

Figures 5A, 5B:
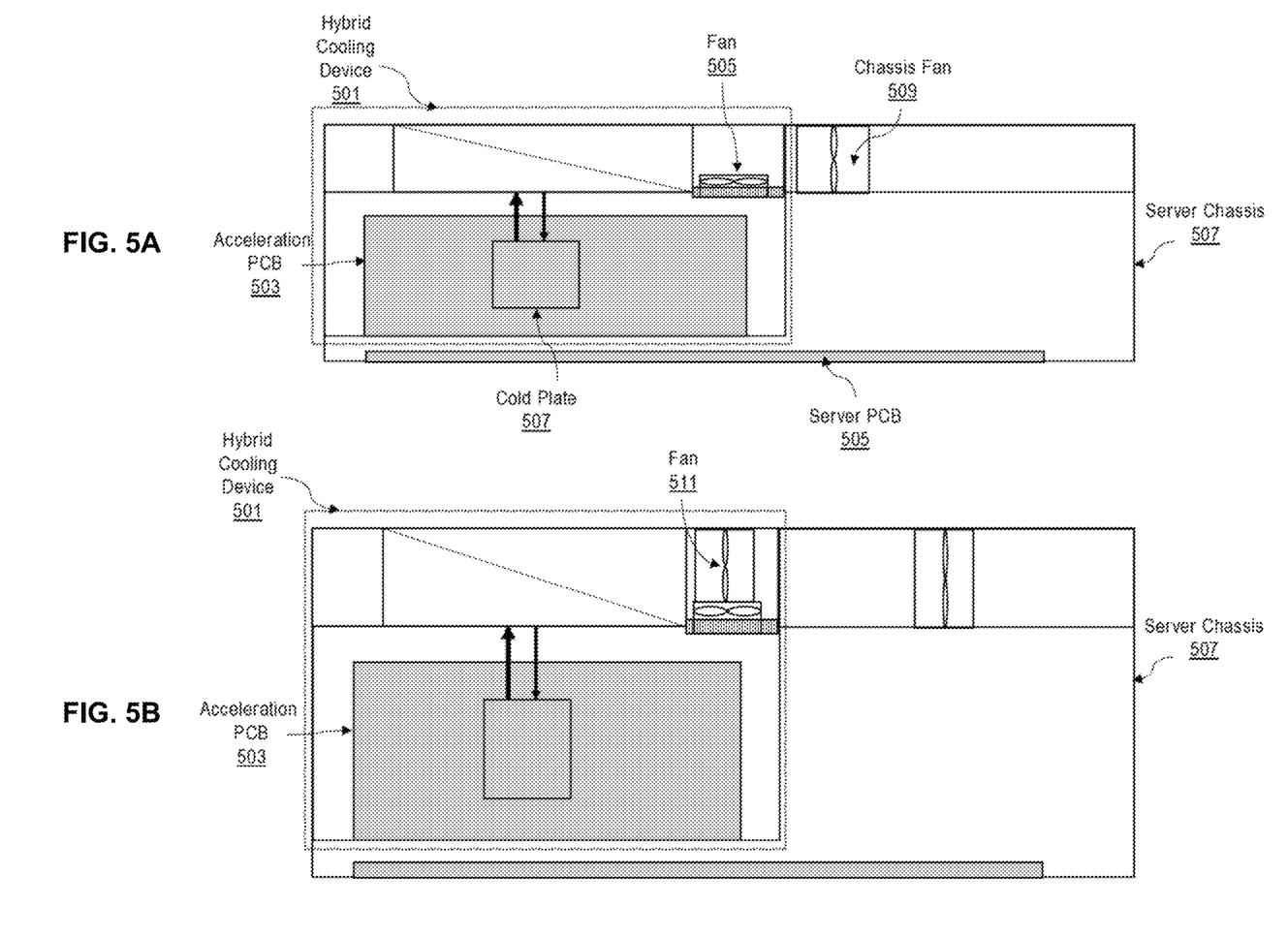
FIGS. 5A-5B show an overall system level use of the hybrid cooling device in a server according to one embodiment.

FIGS. 5A-5B show an overall system level use of the hybrid cooling device according to one embodiment. The figures show that a hybrid cooling device 501 can be integrated into a server chassis 507, where the hybrid cooling device 501 can adapt to the environment of the server chassis 507 and take advantage of the existing server chassis environment and structure.

In FIG. 5A, the hybrid cooling device 501 includes a phase change cooling portion that occurs in a cold plate 507 and a dedicated fan 505 for cooling an acceleration PCB 503 and electronics installed thereon. The dedicated fan 505 can be a cross flow fan, and can be used to assist in generating the airflows shown in FIG. 4.

As further shown, the server chassis 507 can include a server PCB 505 and a chassis fan 509 mounted on the right side of the hybrid cooling device 501. The chassis fan 509, as part of the existing server chassis structure, can function as the primary air mover. Thus, the hybrid cooling device 501 can take advantage of the existing server chassis structure.

In FIG. 5B, an additional fan 511 is integrated into the hybrid cooling device 501 for enhancing airflows. The additional fan 511 can be used for redundancy since the server chassis 507 may not be dedicated for the acceleration PCB 503. The additional fan 511 can further enhance system performance.

Figure 6:
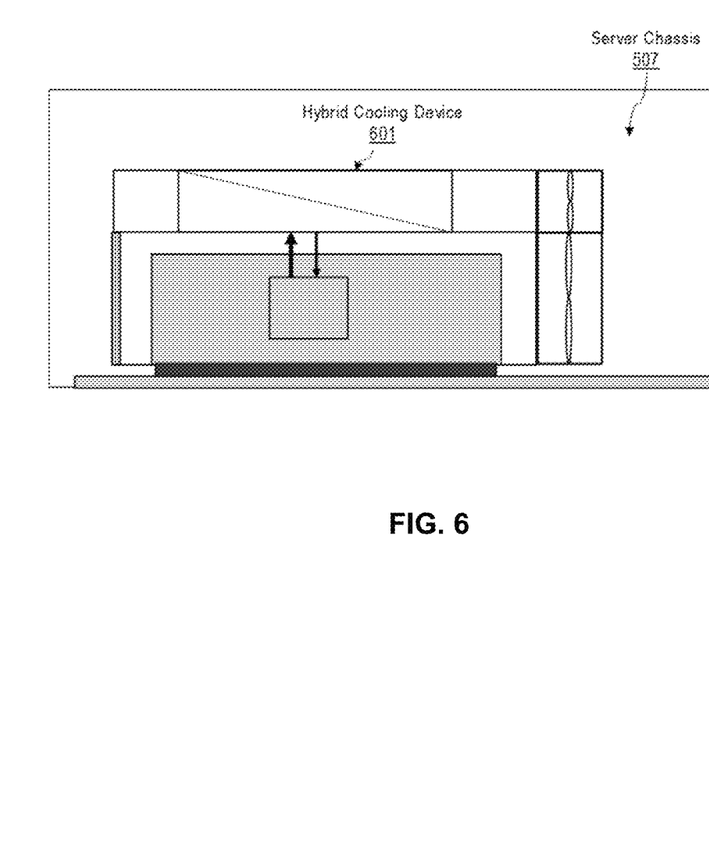
FIG. 6 shows the hybrid cooling device as described in FIG. 2 being deployed in a server chassis according to one embodiment.

FIG. 6 shows the hybrid cooling device as described in FIG. 2 being deployed in a server chassis according to one embodiment.

In this embodiment, unlike the embodiments illustrated in FIGS. 5A-5B, the hybrid cooling device 601 is fully disaggregated from the server chassis 507 in terms of airflow management, which means that no server fan is needed.

In the various embodiments described above, the hybrid cooling device in FIGS. 5A-5B and 6 can be reconfigured by adding additional features to take advantage of the environment in the server chassis 507.

Figure 7A:
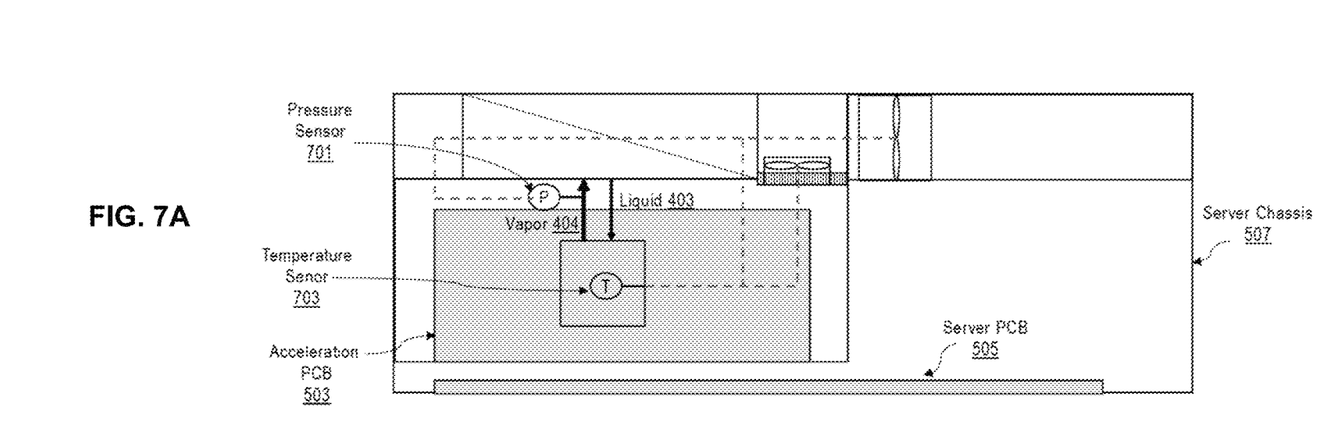
FIGS. 7A-7B show an operation control of the hybrid cooling device according to one embodiment.
Figure 7B:
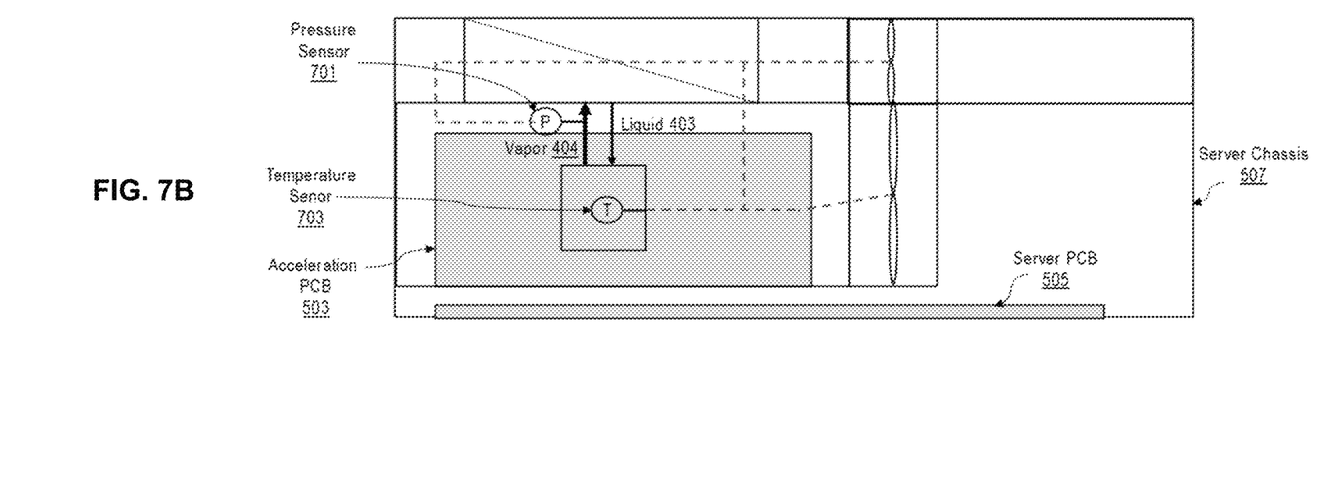

FIGS. 7A-7B show how the hybrid cooling device is controlled according to one embodiment.

As shown, the hybrid cooling device can include two sensors. A pressure sensor 701 can be attached to the vapor line 403 to measure the pressure of the vapor passing through the vapor line 404. A temperature sensor 703 can be provided in the cold plate to measure the temperature of the cold plate. These two sensors 701 and 703 are decoupled from any of the electronics on the PCB 503. The decoupling can significantly increase the adaptability and reliability of the cooling solution. In one embodiment, the temperature sensor can be a sensor in the chip package, such as a sensor for measuring the case temperatures. In this case, only the pressure is needed on the hybrid cooling device for the purpose of controlling the operation of the hybrid cooling device.

In one embodiment, the two sensors 701 and 703 are used for controlling the fan or fans of the hybrid cooling device only, and the device control applies to only the hardware of the device, and does not apply to the PCBs 503 and 505 and the electronics on the two PCBs. Such a design can increase the hybrid cooling device's deployability, tunability, and interoperability. The design aims to simplify the system integration and tuning procedures, which means plug and play.

Figure 8:
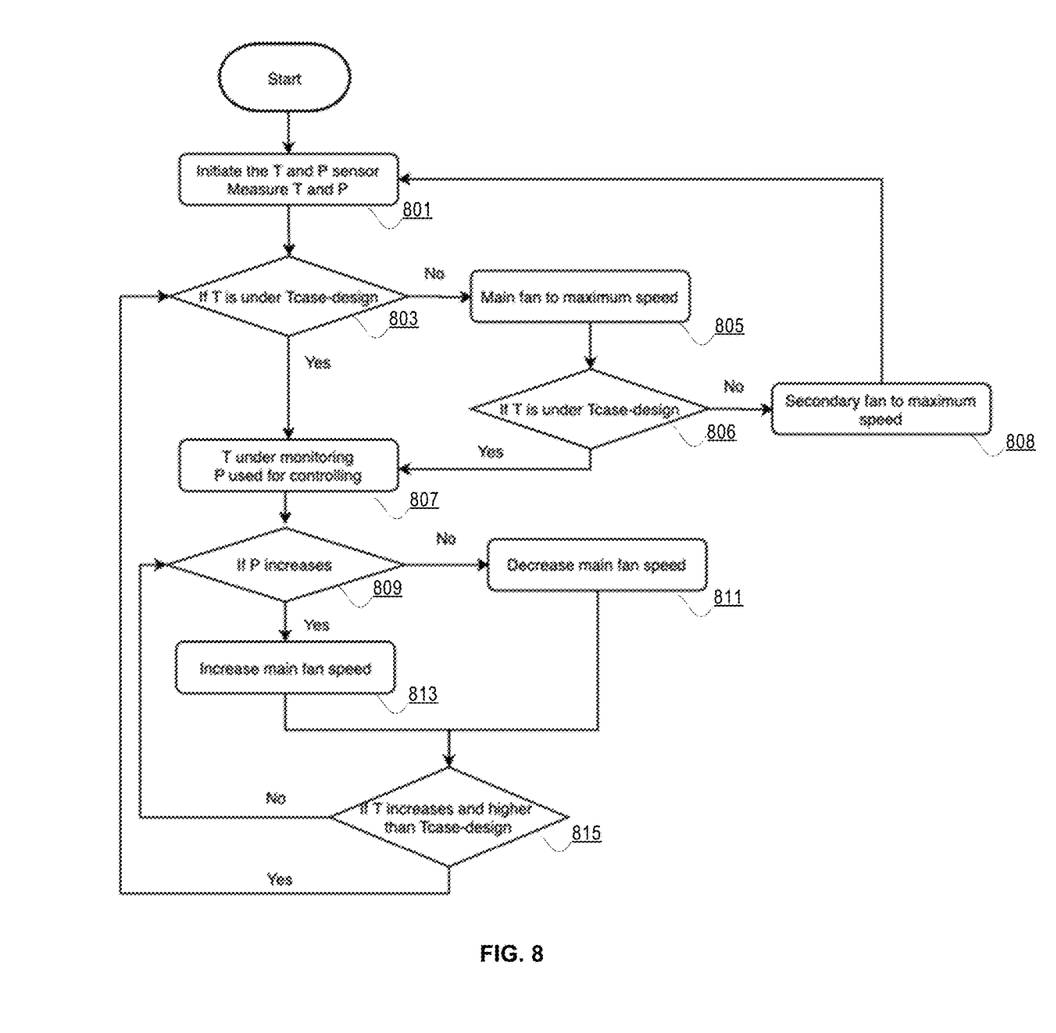
FIG. 8 is a flow diagram illustrating a control flow process 800 for the hybrid cooling device according to one embodiment.

FIG. 8 is a flow diagram illustrating a control flow process 800 for the hybrid cooling device according to one embodiment.

As shown in FIG. 8, a temperature sensor and a pressure sensor are used for controlling the operation of the hybrid cooling device, which includes a main fan and a secondary fan. The flow control process 400 may be performed by processing logic which may include software, hardware, or a combination thereof.

In operation 801, the processing logic initiates the temperature sensor to measure the temperature inside the cold plate in the hybrid cooling device, and initiates the pressure sensor to measure the pressure of the vapor passing through the vapor line.

In operation 803, the processing logic determines whether the measured temperature is under a predetermined threshold (i.e., $T_{case-design}$).

In operation 805, if the measured temperature is not under the predetermined threshold, the processing logic can send commands to run the main fan in the hybrid cooling device to its maximum speed.

In operation 806, the processing logic determines whether the measured temperature has decreased under the predetermined threshold due to the blowing of the main fan at its maximum speed.

In operation 807, the measured temperature has decreased under the threshold hold. The processing logic continues monitoring the temperature, and also uses the measured pressure to control the operation of the hybrid cooling device.

In operation 808, the measured temperature has not decreased under the threshold hold, and the processing logic runs the secondary fan to its maximum speed.

In operation 809, the processing logic determines whether the measures pressure has increased.

In operation 811, the processing logic determines that the measured pressure has not increased and accordingly decreases the speed of the main fan.

In operation 813, the processing logic determines that the measured pressure has increased, and accordingly increases the speed of the main fan if the main fan is not running at its maximum speed.

In operation 815, the processing logic determines whether the measured temperature exceeds the predetermined threshold. If so, the processing logic will monitor the measured temperature to determine if it decreases under the predetermined threshold; otherwise, the processing logic will check if the measured pressure has increased.

Figure 9:
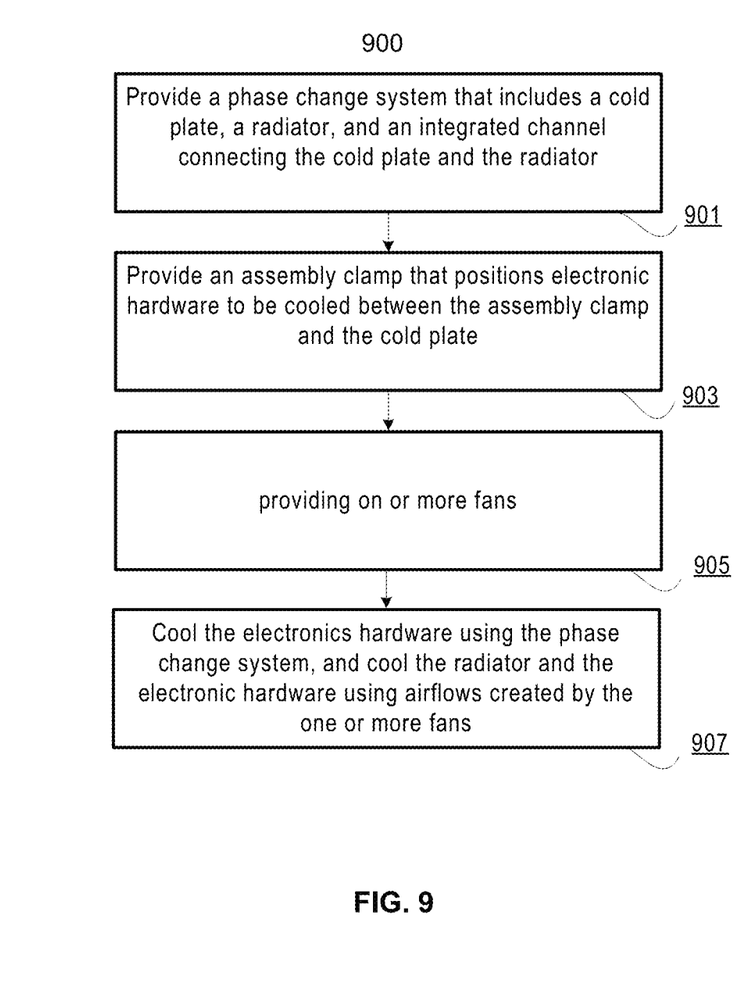
FIG. 9 illustrates a method 900 of cooling a heterogeneous computing architecture according to one embodiment.

FIG. 9 illustrates a method 900 of cooling a heterogeneous computing architecture according to one embodiment.

As shown in FIG. 9, in block 901 a phase change system that includes a cold plate, a radiator, and an integrated channel connecting the cold plate and the radiator. In block 903 an assembly clamp is provided to position electronic hardware to be cooled between the assembly clamp and the cold plate. In block 903, one or more fans are provided. The fans can be integrated with the cold plate and the radiator or can be separate fans. In block 907, the phase change system is used to cool the electronics hardware, and the airflows created by the one or more fans are used to cool the radiator and the electronic hardware.

Figure 10:
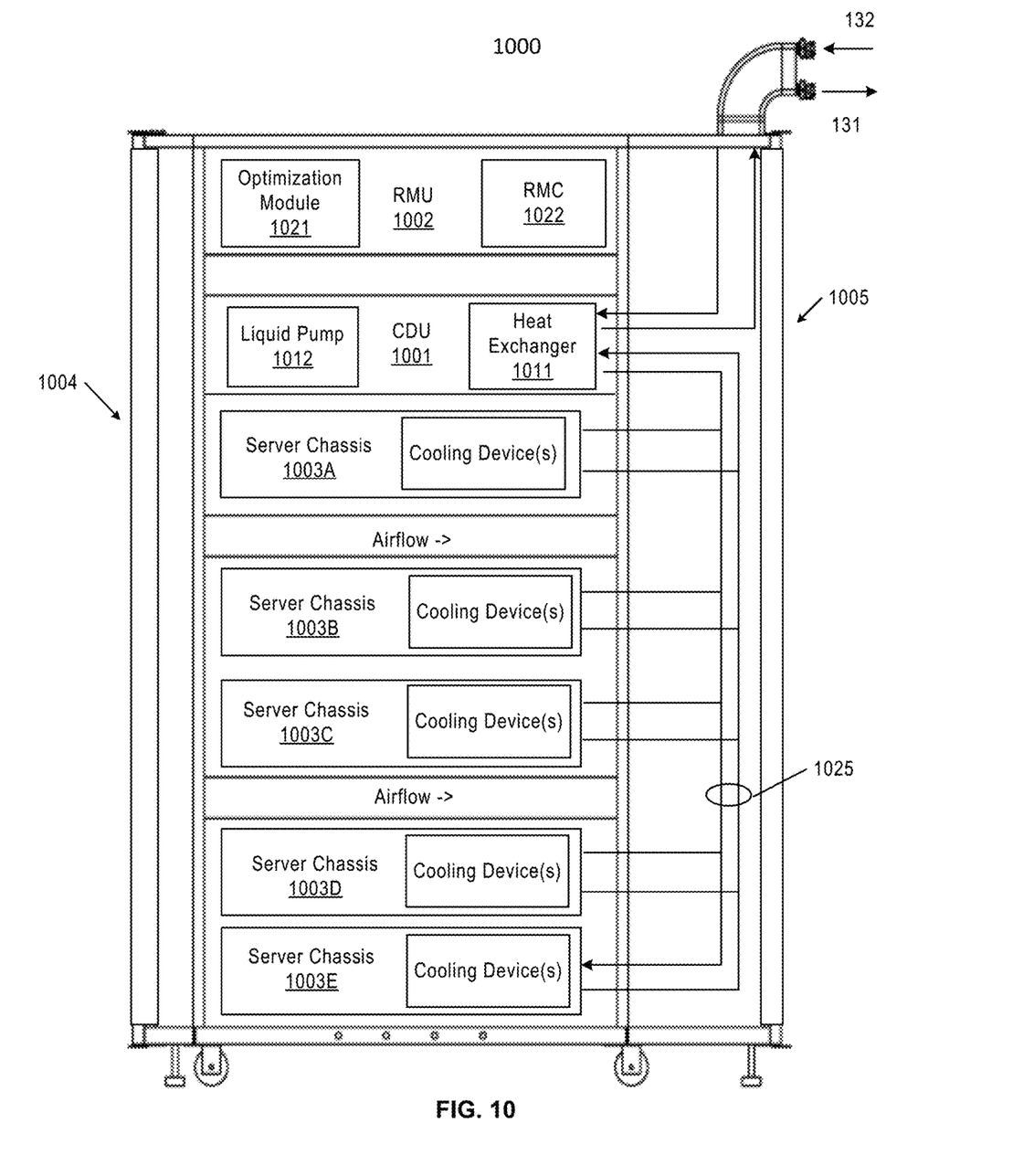
FIG. 10 is block diagram illustrating an electronic rack according to one embodiment.

FIG. 10 is block diagram illustrating an electronic rack according to one embodiment. Electronic rack 1000 may represent any of the electronic racks of a data center. Referring to FIG. 10, according to one embodiment, electronic rack 1000 includes, but is not limited to, CDU 1001, rack management unit (RMU) 1002, and one or more server chassis 1003A-1003E (collectively referred to as server chassis 1003). Server chassis 1003 can be inserted into an array of server slots (e.g., standard shelves) respectively from frontend 1004 or backend 1005 of electronic rack 1000. Note that although there are five server chassis 1003A-1003E shown here, more or fewer server chassis may be maintained within electronic rack 1000. Also note that the particular positions of CDU 1001, RMU 1002, and/or server chassis 1003 are shown for the purpose of illustration only; other arrangements or configurations of CDU 1001, RMU 1002, and/or server chassis 1003 may also be implemented. In one embodiment, electronic rack 1000 can be either open to the environment or partially contained by a rack container, as long as the cooling fans can generate airflows from the frontend to the backend.

In addition, for at least some of the server chassis 1003, an optional fan module (not shown) is associated with the server chassis. Each of the fan modules includes one or more cooling fans. The fan modules may be mounted on the backends of server chassis 1003 or on the electronic rack to generate airflows flowing from frontend 1004, traveling through the air space of the sever chassis 1003, and existing at backend 1005 of electronic rack 1000.

In one embodiment, CDU 1001 mainly includes heat exchanger 1011, liquid pump 1012, and a pump controller (not shown), and some other components such as a liquid reservoir, a power supply, monitoring sensors and so on. Heat exchanger 1011 may be a liquid-to-liquid heat exchanger. Heat exchanger 1011 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 1005 of electronic rack 1000. The liquid supply/return lines 131-132, also referred to as room liquid supply/return lines, may be coupled to an external cooling system (e.g., a data center room cooling system).

In addition, heat exchanger 1011 further includes a second loop with two ports having a second pair of liquid connectors coupled to liquid manifold 1025 (also referred to as a rack manifold) to form a secondary loop, which may include a supply manifold (also referred to as a rack liquid supply line or rack supply manifold) to supply cooling liquid to server chassis 1003 and a return manifold (also referred to as a rack liquid return line or rack return manifold) to return warmer liquid back to CDU 1001. Note that CDUs 1001 can be any kind of CDUs commercially available or customized ones. Thus, the details of CDUs 1001 will not be described herein.

Each of server chassis 1003 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 1003 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 1000 further includes optional RMU 1002 configured to provide and manage power supplied to servers 1003, and CDU 1001. RMU 1002 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 1000.

In one embodiment, RMU 1002 includes optimization module 1021 and rack management controller (RMC) 1022. RMC 1022 may include a monitor to monitor operating status of various components within electronic rack 1000, such as, for example, computing nodes 1003, CDU 1001, and the fan modules. Specifically, the monitor receives operating data from various sensors representing the operating environments of electronic rack 1000. For example, the monitor may receive operating data representing temperatures of the processors, cooling liquid, and airflows, which may be captured and collected via various temperature sensors. The monitor may also receive data representing the fan power and pump power generated by the fan modules and liquid pump 1012, which may be proportional to their respective speeds. These operating data are referred to as real-time operating data. Note that the monitor may be implemented as a separate module within RMU 1002.

Based on the operating data, optimization module 1021 performs an optimization using a predetermined optimization function or optimization model to derive a set of optimal fan speeds for the fan modules and an optimal pump speed for liquid pump 1012, such that the total power consumption of liquid pump 1012 and the fan modules reaches minimum, while the operating data associated with liquid pump 1012 and cooling fans of the fan modules are within their respective designed specifications. Once the optimal pump speed and optimal fan speeds have been determined, RMC 1022 configures liquid pump 1012 and cooling fans of the fan modules based on the optimal pump speeds and fan speeds.

As an example, based on the optimal pump speed, RMC 1022 communicates with a pump controller of CDU 1001 to control the speed of liquid pump 1012, which in turn controls a liquid flow rate of cooling liquid supplied to the liquid manifold 1025 to be distributed to at least some of server chassis 1003. Similarly, based on the optimal fan speeds, RMC 1022 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 10 is shown and described for the purpose of illustration only; other configurations or arrangements may also be applicable. For example, CDU 1001 may be an optional unit. The cold plates of server chassis 1003 may be coupled to a rack manifold, which may be directly coupled to room manifolds 131-132 without using a CDU. Although not shown, a power supply unit may be disposed within electronic rack 1000. The power supply unit may be implemented as a standard chassis identical or similar to a sever chassis, where the power supply chassis can be inserted into any of the standard shelves, replacing any of server chassis 1003. In addition, the power supply chassis may further include a battery backup unit (BBU) to provide battery power to server chassis 1003 when the main power is unavailable. The BBU may include one or more battery packages and each battery package include one or more battery cells, as well as the necessary charging and discharging circuits for charging and discharging the battery cells.

In one embodiment, the cooling devices disposed in each of the server chassis as shown may represent any cooling device described throughout this application.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:
1. A hybrid cooling device, comprising:
   a phase change system that includes a cold plate, a radiator, and an integrated channel connecting the cold plate and the radiator;
   an assembly clamp to position electronic hardware to be cooled between the assembly clamp and the cold plate, wherein the radiator is positioned above the cold plate, and wherein the cold plate is positioned vertically to be attached to the electronic hardware when the assembly clamp clamps onto the cold plate; and
   one or more fans to provide air cooling the radiator and the electronic hardware, wherein the electronic hardware includes a printed circuit board (PCB) and an electronic device packaged thereon, the electronic device including one or more of a chip or a power electronic, and wherein the phase change system, the assembly clamp and the one or more fans together with the electronic device packaged on the PCB can be inserted into a peripheral bus as an integrated peripheral device.

2. The hybrid cooling device of claim 1, further comprising:
- a device frame, wherein the radiator, the integrated channel, and the cold plate are attached to the device frame.

3. The hybrid cooling device of claim 1 further comprising:
- an adapting stiffener positioned between the cold plate and the electronic hardware;
- an elastic channel;
- wherein the adapting stiffener and the elastic channel operate in conjunction to maintain proper pressure on the electronic hardware.

4. The hybrid cooling device of claim 3, further comprising:
- a moving axis in the elastic channel;
- wherein one end of the assembly clamp is inserted into the elastic channel through the moving axis such that the end of the assembly clamp is moveable on the elastic channel.

5. The hybrid cooling device of claim 4, wherein the elastic channel provides forces on the moving axis on both sides horizontally to properly fix the electronic hardware within the hybrid cooling device.

6. The hybrid cooling device of claim 1, wherein the integrated channel includes a vapor line and a liquid line, the liquid line for passing liquid from the radiator to the cold plate, and the vapor line for passing vapor from the cold plate to the radiator.

7. The hybrid cooling device of claim 1, wherein each of the one or more fans is integrated into the hybrid cooling device or a separate fan.

8. The hybrid cooling device of claim 1, wherein airflows created by the one or more fans pass through the cold plate through a first dedicated channel, and pass through the radiator through a second dedicated channel.

9. The hybrid cooling device of claim 4, further comprising:
- a temperature sensor;
- a pressure sensor;
- wherein the temperature sensor and the pressure sensor are used to control an operation of the hybrid cooling device.

10. A server chassis, comprising:
a hybrid cooling device including:
- a phase change system that includes a cold plate, a radiator, and an integrated channel connecting the cold plate and the radiator,
- an assembly clamp to position electronic hardware to be cooled between the assembly clamp and the cold plate, wherein the radiator is positioned above the cold plate, and wherein the cold plate is positioned vertically to be attached to the electronic hardware when the assembly clamp clamps onto the cold plate, and
- one or more fans to provide air cooling the radiator and the electronic hardware, wherein the electronic hardware includes a printed circuit board (PCB) and an electronic device packaged thereon, and wherein the phase change system, the assembly clamp and the one or more fans together with the electronic device packaged on the PCB can be inserted in to a peripheral bus as an integrated peripheral device; and
a chassis fan to provide an airflow to cool the server chassis and the hybrid cooling device.

11. The server chassis of claim 10, wherein the electronic device includes one or more of a chip or a power electronics, and wherein the peripheral bus is a peripheral component interconnect express (PCIe) bus assembled with the hybrid cooling device.

12. The server chassis of claim 10, wherein the hybrid cooling device further comprise:
- a device frame, wherein the radiator, the integrated channel, and the cold plate are attached to the device frame.

13. The server chassis of claim 12, wherein the hybrid cooling device further comprise:
- an adapting stiffener positioned between the cold plate and the electronic hardware;
- an elastic channel;
- wherein the adapting stiffener and the elastic channel operate in conjunction to maintain proper pressure on the electronic hardware.

14. The server chassis of claim 13, wherein the hybrid cooling device further comprise:
- a moving axis in the elastic channel;
- wherein one end of the assembly clamp is inserted into the elastic channel through the moving axis such that the end of the assembly clamp is moveable on the elastic channel.

15. The server chassis of claim 14, wherein the elastic channel provides forces on the moving axis on both sides horizontally to properly fix the electronic hardware within the hybrid cooling device.

16. The server chassis of claim 10, wherein the integrated channel includes a vapor line and a liquid line, the liquid line for passing liquid from the radiator to the cold plate, and the vapor line for passing vapor from the cold plate to the radiator.

17. The server chassis of claim 10, wherein each of the one or more fans is integrated into the hybrid cooling device or a separate fan.

18. The server chassis of claim 10, wherein airflows created by the one or more fans pass through the cold plate through a first dedicated channel, and pass through the radiator through a second dedicated channel.

19. The server chassis of claim 14, wherein the hybrid cooling device further comprise:
- a temperature sensor;
- a pressure sensor;
- wherein the temperature sensor and the pressure sensor are used to control an operation of the hybrid cooling device.

20. An electronic rack, comprising:
a plurality of server chassis, each server chassis including:
a hybrid cooling device comprising:
- a phase change system that includes a cold plate, a radiator, and an integrated channel connecting the cold plate and the radiator,
- an assembly clamp to position electronic hardware to be cooled between the assembly clamp and the cold plate, wherein the radiator is positioned above the cold plate, and wherein the cold plate is positioned vertically to be attached to the electronic hardware when the assembly clamp clamps onto the cold plate, and
- one or more fans to provide air cooling the radiator and the electronic hardware, wherein the electronic hardware includes a printed circuit board (PCB) and an electronic device packaged thereon, the electronic device including one or more of a chip or a power electronic, and
- wherein the phase change system, the assembly clamp and the one or more fans together with the electronic device packaged on the PCB can be inserted into a peripheral bus as an integrated peripheral device; and a chassis fan to provide an airflow to cool the server chassis and the hybrid cooling device.

\* \* \* \* \*